(12) United States Patent
Hsiao et al.

(10) Patent No.: US 7,576,381 B2
(45) Date of Patent: Aug. 18, 2009

(54) MEMORY STRUCTURE AND FABRICATING METHOD THEREOF

(75) Inventors: Ching-Nan Hsiao, Kaohsiung County (TW); Ying-Cheng Chuang, Taoyuan County (TW); Chung-Lin Huang, Taoyuan County (TW); Shih-Yang Chiu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 5 days.

(21) Appl. No.: 11/955,397

(22) Filed: Dec. 13, 2007

(65) Prior Publication Data

US 2008/0265302 A1    Oct. 30, 2008

(30) Foreign Application Priority Data

Apr. 27, 2007    (TW) .............................. 96115032 A

(51) Int. Cl.
*H01L 27/108* (2006.01)

(52) U.S. Cl. ................. 257/301; 257/303; 257/311; 257/E27.092

(58) Field of Classification Search ............... 257/239, 257/261, 314, 315, 490, E29.129, E29.3, 257/E21.422, 301, 303, 311; 438/201, 211, 438/257, 593, FOR. 203

See application file for complete search history.

(56) References Cited

U.S. PATENT DOCUMENTS

| 6,078,076 | A   | * | 6/2000  | Lin et al. ................... 257/321 |
| 6,495,853 | B1  |   | 12/2002 | Holbrook et al. |
| 6,703,274 | B1  | * | 3/2004  | Chidambarrao et al. ..... 438/243 |
| 7,192,832 | B2  | * | 3/2007  | Chang et al. ................ 438/259 |
| 7,294,879 | B2  | * | 11/2007 | Chen et al. ................... 257/302 |
| 2002/0102793 | A1 | * | 8/2002  | Wu ............................ 438/257 |
| 2002/0155664 | A1 | * | 10/2002 | Noro .......................... 438/263 |
| 2007/0202646 | A1 | * | 8/2007  | Tseng ......................... 438/257 |
| 2007/0287245 | A1 | * | 12/2007 | Hieda et al. ................. 438/211 |
| 2008/0188052 | A1 | * | 8/2008  | Winstead et al. ............ 438/299 |

* cited by examiner

*Primary Examiner*—Wai-Sing Louie
(74) *Attorney, Agent, or Firm*—Jianq Chyun IP Office

(57) ABSTRACT

A memory structure including a substrate, a first dielectric layer, a first conducting layer, a second conducting layer, a second dielectric layer, a spacer and a doped region is provided. The substrate has a trench wherein. The first dielectric layer is disposed on the interior surface of the trench. The first conducting layer is disposed on the first dielectric layer of the lower portion of the trench. The second conducting layer is disposed above the first conducting layer and filling the trench. The second dielectric layer is disposed between the first conducting layer and the second conducting layer. The spacer is disposed between the first dielectric layer and the second conducting layer. The doped region is disposed in the substrate of a side of the trench.

20 Claims, 3 Drawing Sheets

MEMORY STRUCTURE AND FABRICATING METHOD THEREOF

CROSS-REFERENCE TO RELATED APPLICATION

This application claims the priority benefit of Taiwan application serial no. 96115032, filed on Apr. 27, 2007. The entirety of the above-mentioned patent application is hereby incorporated by reference herein and made a part of this specification.

BACKGROUND OF THE INVENTION

1. Field of the Invention

The present invention generally relates to a memory structure and fabricating method thereof, more particularly, to a flash memory structure and fabricating method thereof.

2. Description of Related Art

Flash memory device is a type of non-volatile memory that allows multiple data writing, reading and erasing operations. Furthermore, the stored data will be retained even after power to the device is removed. With these advantages, flash memory has been broadly applied in personal computer and electronic equipment.

A typical flash memory device has a floating gate and a control gate fabricated using doped polysilicon. Moreover, the control gate is directly disposed on the floating gate. The floating gate is isolated from the control gate by an inter-gate dielectric layer and the floating gate is isolated from the substrate by a tunnel oxide layer (that is, the so-called stack gate flash memory).

FIG. 1 is a schematic cross-sectional view of a conventional stack gate flash memory structure.

In the stack gate flash memory shown in FIG. 1, the stack gate structure 102 on the substrate 100 includes a tunnel oxide layer 104, a floating gate 106, an inter-gate dielectric layer 108 and a control gate 110. The source region 112 and the drain region 114 are disposed in the substrate 100 on each side of the stack gate structure 102. Furthermore, the contact window 118 in the dielectric layer 116 connects the drain region 114 and the conducting line 120.

As integrated circuits are aiming toward a higher level of integration through miniaturization, the dimension of each memory cell in a flash memory device must be reduced in order to increase the integration of memory devices. The miniaturization of memory cell can be achieved through a reduction of the gate length of a memory cell and a reduction of the isolating partition between data lines. However, reducing the gate length will shorten the channel length under the tunnel oxide layer 104 and can easily lead to abnormal punch through between the source region 112 and the drain region 114. Therefore, electrical performance of the memory cell can be adversely affected.

On the other hand, the larger the gate coupling rate (GCR) between the control gate 110 and the floating gate 106, the lower operating voltage required to operate the memory so that the memory can have a higher performance. However, in a conventional stack gate flash memory, two adjacent floating gates 106 are isolated from each other through the dielectric layer 116. Since adjacent floating gates 106 are coupled, induced capacitance will be generated. As a result, the GCR of the flash memory is reduced and the performance of the flash memory is compromised.

SUMMARY OF THE INVENTION

Accordingly, the present invention provides a memory structure capable of preventing abnormal punch through so that the memory can have better electrical performance.

The present invention also provides a method of fabricating a memory that can be easily integrated with the existing semiconductor process.

According to an embodiment of the present invention, a memory structure including a substrate, a first dielectric layer, a first conducting layer, a second conducting layer, a second dielectric layer, a spacer and a doped region is provided. The substrate has a trench. The first dielectric layer is disposed on the interior surface of the trench. The first conducting layer is disposed on the first dielectric layer of the lower portion of the trench. The second conducting layer is disposed above the first conducting layer and filling the trench. The second dielectric layer is disposed between the first conducting layer and the second conducting layer. The spacer is disposed between an inner surface of the first dielectric layer in the upper portion of the trench and the second conducting layer. The doped region is disposed in the substrate of a side of the trench.

According to the foregoing memory structure in the embodiment of the present invention, the spacer is disposed on the first conducting layer, while the second dielectric layer is formed inside the spacer to cover a top face of the first conducting layer.

According to the foregoing memory structure in the embodiment of the present invention, the material of the first dielectric layer includes silicon oxide.

According to the foregoing memory structure in the embodiment of the present invention, the material of the first conducting layer includes polysilicon.

According to the foregoing memory structure in the embodiment of the present invention, the material of the second conducting layer includes polysilicon.

According to the foregoing memory structure in the embodiment of the present invention, the material of the second dielectric layer includes a silicon oxide layer and an oxide/nitride/oxide composite layer.

According to the foregoing memory structure in the embodiment of the present invention, the material of the spacer includes silicon nitride.

The present invention also provides a method of fabricating a memory comprising the following steps. First, a trench is formed in a substrate. Next, a first dielectric layer is formed on an interior surface of the trench. Thereafter, a first conducting layer is formed on the first dielectric layer of a lower portion of the trench. Next, a spacer is formed on the first dielectric layer of an upper portion of the trench. Afterwards, a second dielectric layer is formed on the first conducting layer. Next, a second conducting layer is formed on the second dielectric layer and filling the trench. Finally, a doped region is formed in the substrate of a side of the trench.

According to the foregoing method of fabricating the memory in the embodiment of the present invention, the method of forming the trench includes the following steps. First, a patterned mask layer is formed on the substrate. Next, a portion of the substrate is removed by using the patterned mask layer as a mask.

According to the foregoing method of fabricating the memory in the embodiment of the present invention, the patterned mask layer includes a pad oxide layer and a pad silicon nitride layer.

According to the foregoing method of fabricating the memory in the embodiment of the present invention, the method of removing a portion of the substrate includes performing a dry etching process.

According to the foregoing method of fabricating the memory in the embodiment of the present invention, the method of forming the first dielectric layer includes performing a thermal oxidation process.

According to the foregoing method of fabricating the memory in the embodiment of the present invention, the method of forming the first conducting layer includes the following steps. First, a first conducting material layer is formed on the substrate and the first conducting material layer fills the trench. Next, the first conducting material layer is etched in an etching back process.

According to the foregoing method of fabricating the memory in the embodiment of the present invention, the method of forming the first conducting layer includes performing a chemical vapor deposition process.

According to the foregoing method of fabricating the memory in the embodiment of the present invention, the method of forming the spacer includes the following steps. First, a spacer material layer is formed on the substrate. Next, the space material layer is etched in an etching process.

According to the foregoing method of fabricating the memory in the embodiment of the present invention, the method of forming the spacer material layer includes performing a chemical vapor deposition process.

According to the foregoing method of fabricating the memory in the embodiment of the present invention, the second dielectric layer includes a silicon oxide layer and an oxide/nitride/oxide composite layer.

According to the foregoing method of fabricating the memory in the embodiment of the present invention, the method of forming the second conducting layer includes the following steps. First, a second conducting material layer is formed on the substrate and the second conducting material layer fills the trench. Next, a portion of the second conducting material layer outside the trench is removed.

According to the foregoing method of fabricating the memory in the embodiment of the present invention, the method of removing a portion of the second conducting material layer includes performing a chemical-mechanical polishing process.

According to the foregoing method of fabricating the memory in the embodiment of the present invention, the method of forming the doped region includes performing an ion implantation process.

Accordingly, because the floating gate and the control gate of the memory structure in the present invention are formed in a trench, a longer channel length capable of preventing abnormal punch through between the doped region located of a side of the trench can be haven. As a result, the memory has better electrical performance.

In addition, because the two adjacent floating gates in the memory structure of the present invention are isolated from each other through the substrate, induced capacitance between adjacent floating gates can be prevented so as to increase the GCR of the memory. Consequently, the performance of the flash memory is improved.

Furthermore, the method of fabricating memory according to the present invention has the advantage of being relatively simple to perform and can be easily combined with the existing semiconductor processes.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
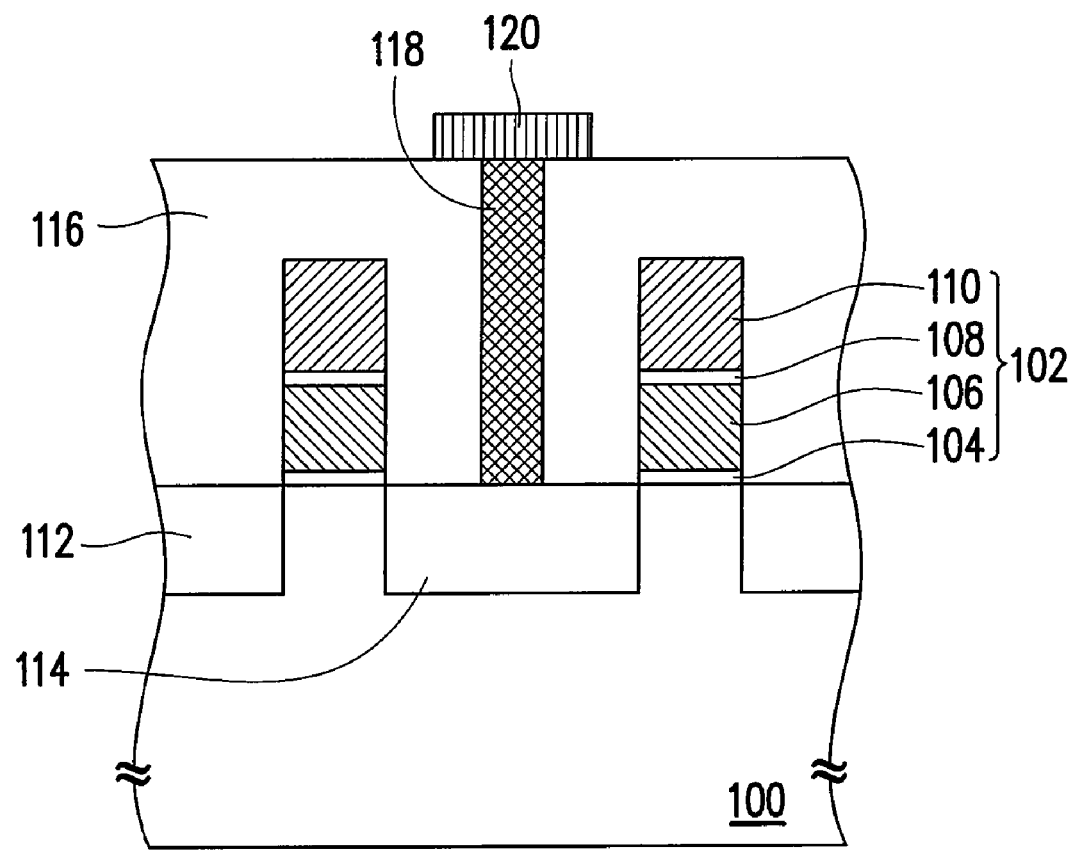
FIG. 1 is a schematic cross-sectional view of a conventional stack gate flash memory structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
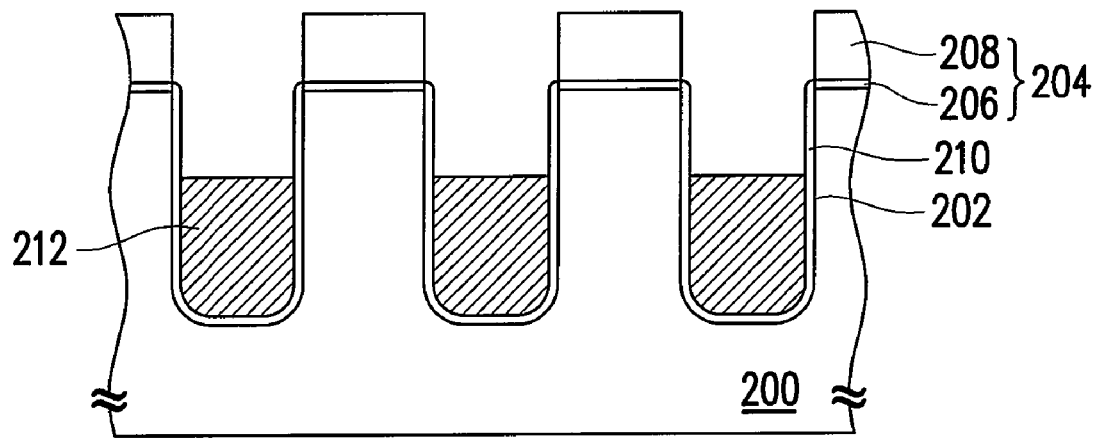
FIGS. 2A to 2C are schematic cross-sectional views illustrating a method of fabricating a memory according to an embodiment of the present invention.
Figure 2B:
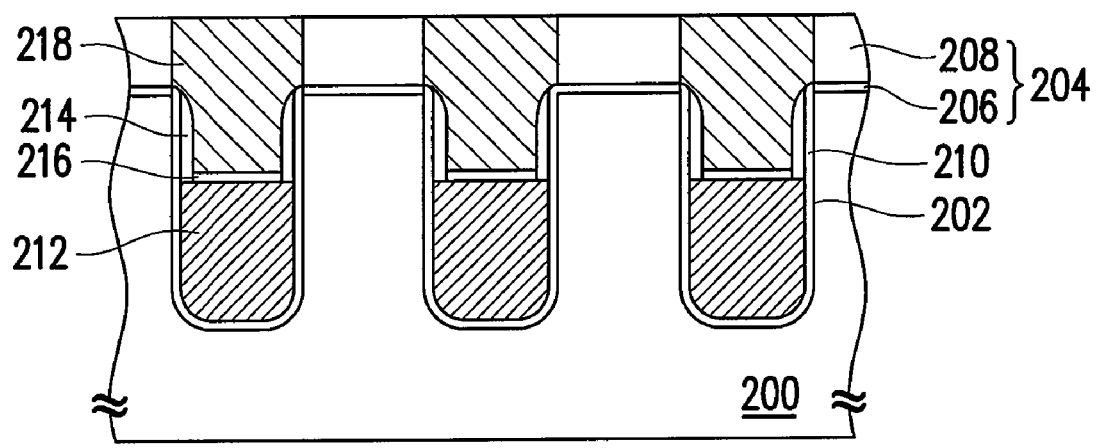
Figure 2C:
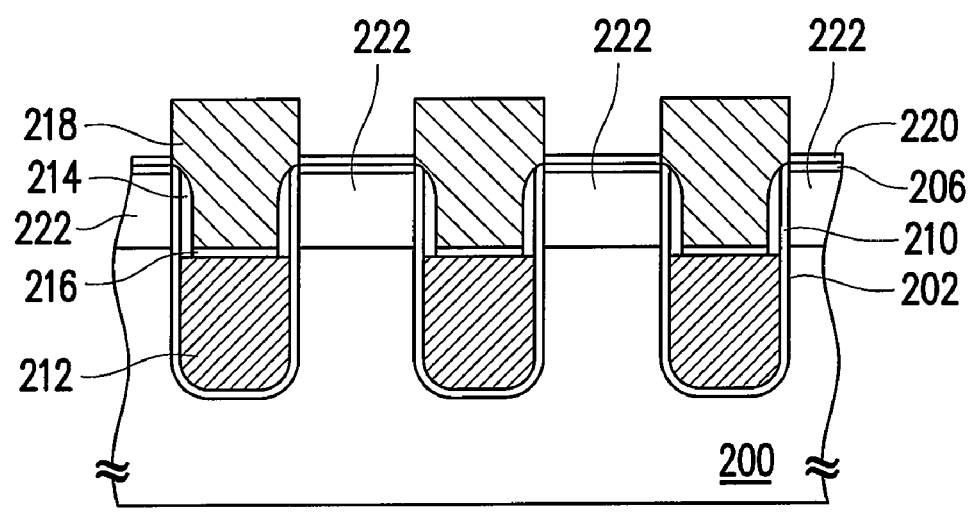

FIGS. 2A to 2C are schematic cross-sectional views illustrating a method of fabricating a memory according to an embodiment of the present invention.

First, as shown in FIG. 2A, trenches 202 are formed in a substrate 200. The substrate 200 is a silicon substrate, for example. The method of forming the trenches 202 includes, for example, forming a patterned mask layer 204 on the substrate 200 and removing a portion of the substrate 200 by using the patterned mask layer 204 as a mask. The patterned mask layer 204 includes a pad oxide layer 206 and a pad silicon nitride layer 208. The method of forming the pad oxide layer 206 includes performing an oxidation process and the method of forming the pad silicon nitride layer 208 includes performing a chemical vapor deposition process, for example. The method of removing a portion of the substrate 200 includes performing a dry etching process, for example.

Next, a first dielectric layer 210 is formed on the interior surface of the trenches 202 to serve as a gate dielectric layer. The material of the first dielectric layer 210 is silicon oxide and the method of forming the first dielectric layer 210 includes performing a thermal oxidation process, for example.

Thereafter, a first conducting layer 212 is formed on the first dielectric layer 210 of a lower portion of the trenches 202 to serve as a floating gate. The material of the first conducting layer 212 includes polysilicon, for example. The method of forming the first conducting layer 212 includes, for example, forming a first conducting material layer (not shown) on the substrate 200 to fill the trenches 202 by using a chemical vapor deposition and etching back the first conducting material layer thereafter. The process of etching back the first conducting material layer includes a dry etching process, for example.

Next, as shown in FIG. 2B, a spacer 214 is formed on the first dielectric layer 210 of an upper portion of the trenches 202. The material of the spacer 214 includes silicon nitride, for example. The method of forming the spacer 214 includes, for example, forming a spacer material layer (not shown) on the substrate 200 by using a chemical vapor deposition process and etching the spacer material layer thereafter. The etching of the spacer material layer includes a dry etching process, for example.

Thereafter, a second dielectric layer 216 is formed on the first conducting layer 212 to serve as an inter-gate dielectric layer. The second dielectric layer 216 is, for example, a single silicon oxide layer formed by performing a thermal oxidation process. Obviously, the second dielectric layer 216 can be a silicon nitride layer, an oxide/nitride composite layer or an oxide/nitride/oxide composite layer. Since anyone skilled in the art should know the method of forming the material layer of the second dielectric layer 216, a detailed description is omitted.

After that, a second conducting layer 218 is formed on the second dielectric layer 216. The second conducting layer 218 fills the trenches 202 and serves as a control gate. The material of the second conducting layer 218 includes polysilicon, for example. The method of forming the second conducting layer 218 includes, for example, forming a second conducting material layer (not shown) on the substrate 200 and filling the trenches 202 by using a chemical vapor deposition process and removing a portion of the second conducting material layer outside the trenches 202. The method of removing a portion of the second conducting material layer includes, for example, performing a chemical-mechanical polishing of the second conducting material layer using the pad silicon nitride layer 208 as a polishing stop layer.

Thereafter, as shown in FIG. 2C, the pad silicon nitride layer 208 is removed. The method of removing the pad silicon nitride layer 208 includes performing a wet etching process, for example.

Additionally, a sacrificial oxide layer 220 can be selectively formed on the pad oxide layer 206. The method of forming the sacrificial oxide layer 220 includes, for example, performing a thermal oxidation process. In another embodiment, the pad oxide layer 206 is removed after removing the silicon nitride layer 208 and then a sacrificial oxide layer 220 is formed on the substrate 200.

Next, a doped region 222 is formed in the substrate 200 of a side of each trench 202 to serve as a source region and a drain region, respectively. The method of forming the doped region includes performing an ion implantation process, for example.

Therefore, the method of fabricating a memory according to the description of the present embodiment is relatively simple and can be easily integrated with the existing semiconductor processes.

In the following, a memory structure of the present invention is described with respect to FIG. 2C.

As shown in FIG. 2C, the memory structure includes a substrate 200, a first dielectric layer 210, a first conducting layer 212, a spacer 214, a second dielectric layer 216, a second conducting layer 218 and a doped region 222. The substrate 200 has a trench 202. The first dielectric layer 210 is disposed on the interior surface of the trench 202. The first conducting layer 212 is disposed on the first dielectric layer 210 of the lower portion of the trench 202. The second conducting layer 218 is disposed above the first conducting layer 212 and filling the trench 202. The second dielectric layer 216 is disposed between the first conducting layer 212 and the second conducting layer 218. The spacer 214 is disposed between the inner surface of the first dielectric layer 210 in the upper portion of the trench 202 and the second conducting layer 218, and the spacer 214 is disposed on the first conducting layer 212, while the second dielectric layer 216 is formed inside the spacer 214 to cover the top face of the first conducting layer 212. The doped region 222 is disposed in the substrate 200 of the side of the trench 202. Since the material and method of forming the components of the memory has been described in detail in the foregoing embodiment, another description is not repeated here.

Accordingly, because the first conducting layer 212 and the second conducting layer 218 are formed in the trench 202, a long channel length between the doped regions 222 of the side of the trench 202 can still be achieved, even when the degree of integration of the memory devices is increased. As a result, abnormal punch through due to the closeness of the source region and the drain region can be avoided so that the memory has better electrical performance.

In summary, the present invention has at least the following advantages:

1. Since the memory structure of the present invention has a longer channel length, abnormal punch through and breakdown of the memory device is avoided and the electrical performance of the memory is improved.

2. The method of fabricating the memory according to the present invention is relatively simple and can be easily integrated with the existing semiconductor processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory structure, comprising:
   a substrate with a trench;
   a first dielectric layer, disposed on an interior surface of the trench;
   a first conducting layer, disposed on the first dielectric layer of a lower portion of the trench, wherein a bottom surface of the trench is entirely covered by the first conducting layer;
   a second conducting layer, disposed above the first conducting layer and filling the trench;
   a second dielectric layer, disposed between the first conducting layer and the second conducting layer;
   a spacer, disposed between an inner surface of the first dielectric layer in an upper portion of the trench and the second conducting layer; and
   a doped region, disposed in the substrate on a side of the trench.

2. The memory structure according to claim 1, wherein the spacer is disposed on the first conducting layer, while the second dielectric layer is formed inside the spacer to cover a top face of the first conducting layer.

3. The memory structure according to claim 1, wherein a material of the first dielectric layer comprises silicon oxide.

4. The memory structure according to claim 1, wherein a material of the first conducting layer comprises polysilicon.

5. The memory structure according to claim 1, wherein a material of the second conducting layer comprises polysilicon.

6. The memory structure according to claim 1, wherein the second dielectric layer comprises a silicon oxide layer and an oxide/nitride/oxide composite layer.

7. The memory structure according to claim 1, wherein a material of the spacer comprises silicon nitride.

8. A method of fabricating a memory, comprising:
   forming a trench in a substrate;
   forming a first dielectric layer on an interior surface of the trench;

forming a first conducting layer on the first dielectric layer of a lower portion of the trench, wherein a bottom surface of the trench is entirely covered by the first conducting layer;

forming a spacer on the first dielectric layer of an upper portion of the trench;

forming a second dielectric layer on the first conducting layer;

forming a second conducting layer on the second dielectric layer and filling the trench; and forming a doped region in the substrate on a side of the trench.

9. The method according to claim 8, wherein the method of forming the trench comprise:

forming a patterned mask layer on the substrate; and removing a portion of the substrate by using the patterned mask layer as a mask.

10. The method according to claim 9, wherein the patterned mask layer comprises a pad oxide layer and a pad silicon nitride layer.

11. The method according to claim 9, wherein the method of removing a portion of the substrate comprises performing a dry etching process.

12. The method according to claim 8, wherein the method of forming the first dielectric layer comprises performing a thermal oxidation process.

13. The method according to claim 8, wherein the method of forming the first conducting layer comprises:

forming a first conductive material layer on the substrate and filling the trench; and performing an etching back process on the first conducting material layer.

14. The method according to claim 13, wherein the method of forming the first conducting material layer comprises performing a chemical vapor deposition process.

15. The method according to claim 8, wherein the method of forming the spacer comprises:

forming a spacer material layer on the substrate; and performing an etching process on the spacer material layer.

16. The method according to claim 15, wherein the method of forming the spacer material layer comprises performing a chemical vapor deposition process.

17. The method according to claim 8, wherein the second dielectric layer comprises a silicon oxide layer and an oxide/nitride/oxide composite layer.

18. The method according to claim 8, wherein the method of forming the second conducting layer comprises:

forming a second conducting material layer on the substrate and filling the trench; and removing a portion of the second conducting material layer outside the trench.

19. The method according to claim 18, wherein the method of removing a portion of the second conducting material layer comprises performing a chemical-mechanical polishing process.

20. The method according to claim 8, wherein the method of forming the doped region comprises performing an ion implantation process.

* * * * *